United States Patent
Hori

(10) Patent No.: US 10,714,572 B2
(45) Date of Patent: Jul. 14, 2020

(54) SILICON CARBIDE EPITAXIAL SUBSTRATE AND METHOD FOR MANUFACTURING A SILICON CARBIDE SEMICONDUCTOR DEVICE

(71) Applicant: SUMITOMO ELECTRIC INDUSTRIES, LTD., Osaka (JP)

(72) Inventor: Tsutomu Hori, Hyogo (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/333,308

(22) PCT Filed: Jun. 5, 2017

(86) PCT No.: PCT/JP2017/020887
§ 371 (c)(1),
(2) Date: Mar. 14, 2019

(87) PCT Pub. No.: WO2018/066173
PCT Pub. Date: Apr. 12, 2018

(65) Prior Publication Data
US 2019/0245044 A1    Aug. 8, 2019

(30) Foreign Application Priority Data

Oct. 4, 2016    (JP) ................... 2016-196636

(51) Int. Cl.
*H01L 29/16* (2006.01)
*H01L 29/04* (2006.01)
(Continued)

(52) U.S. Cl.
CPC ........ *H01L 29/1608* (2013.01); *C23C 16/325* (2013.01); *C23C 16/42* (2013.01);
(Continued)

(58) Field of Classification Search
CPC ... H01L 29/1608; H01L 29/161; H01L 29/78; H01L 29/12; H01L 29/045; H01L 21/205;
(Continued)

(56) References Cited

U.S. PATENT DOCUMENTS

| 7,314,520 B2* | 1/2008 | Powell ............ C30B 23/00 |
| | | 117/109 |
| 2010/0200866 A1* | 8/2010 | Kitou ............. C30B 25/20 |
| | | 257/77 |

(Continued)

FOREIGN PATENT DOCUMENTS

| JP | 2015-002207 | 1/2015 |
| JP | 2016-165004 | 9/2016 |
| WO | 2009/035095 | 3/2009 |

OTHER PUBLICATIONS

"Fundamentals of Silicon Carbide Technology: Growth, Characterization, Devices, and Applications", First Edition, Kimoto et. al., pp. 58, 2014 John Wiley & Sons Singapore Pte Ltd. (Year: 2014).*

*Primary Examiner* — Sitaramarao S Yechuri
(74) *Attorney, Agent, or Firm* — IPUSA, PLLC

(57) ABSTRACT

A silicon carbide epitaxial substrate includes a silicon carbide single-crystal substrate having a diameter of 100 mm or larger and including a principal surface inclined at an angle of more than 0 degrees and not less than 8 degrees with respect to a {0001} plane, a silicon carbide epitaxial layer formed on the principal surface and having a thickness of 20 μm or thicker, and a basal plane dislocation contained in the silicon carbide epitaxial layer and having one end coupled to a threading screw dislocation contained in the silicon carbide epitaxial layer and the other end present in a surface of the silicon carbide epitaxial layer. The basal plane dislocation extends in a direction having a slope of 20 degrees or more and 80 degrees or less with respect to a <11-20>

(Continued)

direction in a {0001} basal plane. Density of the basal plane dislocation is 0.05/cm² or less.

3 Claims, 14 Drawing Sheets

(51) Int. Cl.
| | |
|---|---|
| H01L 21/02 | (2006.01) |
| C23C 16/32 | (2006.01) |
| C30B 29/36 | (2006.01) |
| C30B 25/20 | (2006.01) |
| H01L 21/205 | (2006.01) |
| H01L 29/78 | (2006.01) |
| H01L 29/12 | (2006.01) |
| H01L 29/161 | (2006.01) |
| H01L 21/20 | (2006.01) |
| C23C 16/42 | (2006.01) |

(52) U.S. Cl.
CPC ............. *C30B 25/20* (2013.01); *C30B 29/36* (2013.01); *H01L 21/02378* (2013.01); *H01L 21/02529* (2013.01); *H01L 21/20* (2013.01); *H01L 21/205* (2013.01); *H01L 29/045* (2013.01); *H01L 29/12* (2013.01); *H01L 29/161* (2013.01); *H01L 29/78* (2013.01)

(58) Field of Classification Search
CPC ............... H01L 21/02529; H01L 21/20; H01L 21/02378; C23C 16/42; C23C 16/325; C30B 25/20; C30B 29/36
See application file for complete search history.

(56) References Cited

U.S. PATENT DOCUMENTS

| | | | |
|---|---|---|---|
| 2011/0006309 A1* | 1/2011 | Momose | C23C 16/325 257/77 |
| 2014/0264384 A1* | 9/2014 | Loboda | H01L 21/02378 257/77 |
| 2016/0268381 A1* | 9/2016 | Ota | H01L 29/868 |
| 2018/0216251 A1* | 8/2018 | Aigo | C30B 23/025 |
| 2019/0323145 A1* | 10/2019 | Xu | C30B 23/06 |

* cited by examiner

US 10,714,572 B2

SILICON CARBIDE EPITAXIAL SUBSTRATE AND METHOD FOR MANUFACTURING A SILICON CARBIDE SEMICONDUCTOR DEVICE

TECHNICAL FIELD

The present disclosure relates to a silicon carbide epitaxial substrate and a method for manufacturing a silicon carbide semiconductor device.

The present application is based on and claims priority to Japanese Patent Application No. 2016-196636 filed on Oct. 4, 2016, the entire contents of which are herein incorporated by reference.

BACKGROUND ART

A silicon carbide epitaxial substrate that decreases a threading edge dislocation and a basal plane dislocation coupled to the threading edge dislocation is known as a silicon carbide epitaxial substrate, for example (for example, Patent Document 1).

CITATION LIST

Patent Document

Patent Document 1: International Publication No. WO 2009/035095 Pamphlet

SUMMARY OF THE INVENTION

A silicon carbide epitaxial substrate according to an aspect of the present disclosure includes a silicon carbide single-crystal substrate having a diameter of 100 mm or larger and including a principal surface inclined at an angle of more than 0 degrees and not less than 8 degrees with respect to a {0001} plane, a silicon carbide epitaxial layer formed on the principal surface and having a thickness of 20 μm or thicker, and a basal plane dislocation contained in the silicon carbide epitaxial layer and having one end coupled to a threading screw dislocation contained in the silicon carbide epitaxial layer and the other end present in a surface of the silicon carbide epitaxial layer. The basal plane dislocation extends in a direction having a slope of 20 degrees or more and 80 degrees or less with respect to a <11-20> direction in a {0001} basal plane. Density of the basal plane dislocation is 0.05/cm² or less.

MODE OF CARRYING OUT THE INVENTION

Figure 1:
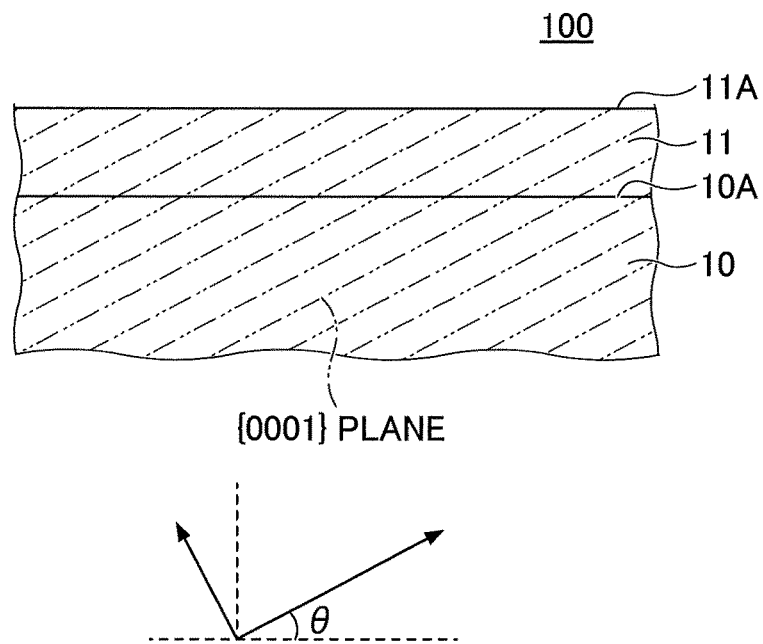
FIG. 1 is a partial cross-sectional view schematically illustrating a silicon carbide epitaxial substrate according to an embodiment of the present disclosure.

[Description of Embodiments of the Present Invention]

In the meantime, it is noted that reliability of a semiconductor device decreases when the semiconductor device is manufactured while using a silicon carbide epitaxial substrate containing many lattice defects that are referred to as dislocations. Hence, a silicon carbide epitaxial substrate without a dislocation is desired, but it is very difficult to manufacture a silicon carbide epitaxial substrate without a dislocation. Accordingly, Patent Document 1 discloses a silicon carbide epitaxial substrate that decreases a threading edge dislocation and a basal plane dislocation coupled to the threading edge dislocation.

However, the reliability of the semiconductor device to be manufactured cannot be sufficiently enhanced in the silicon carbide epitaxial substrate only by decreasing the threading edge dislocation and the basal plane dislocation coupled to the threading edge dislocation.

Hence, a silicon carbide substrate that can manufacture a semiconductor device with high reliability is desired.

Therefore, the present disclosure is intended to provide a silicon carbide substrate and a method for manufacturing a silicon carbide epitaxial substrate that can decrease a basal plane dislocation coupled to a threading screw dislocation as one of purposes.

An embodiment for performing a technique of the present disclosure is described below. Here, a description of the same members and the like is omitted while allotting the same reference characters to the same members.

[Description of Embodiments of the Present Disclosure]

To begin with, embodiments of the present disclosure are listed and described below. In the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ) and { }, respectively. Moreover, a crystallographically negative index is expressed by a number with a bar "-" thereabove, however, a negative sign herein precedes a number. In addition, the epitaxial growth of the present disclosure is a homoepitaxial growth.

[1] A silicon carbide epitaxial substrate according to an embodiment of the present disclosure includes a silicon carbide single-crystal substrate having a diameter of 100 mm or larger and including a principal surface inclined at an angle of more than 0 degrees and not less than 8 degrees with respect to a {0001} plane; a silicon carbide epitaxial layer formed on the principal surface and having a thickness of 20 μm or thicker; and a basal plane dislocation contained in the silicon carbide epitaxial layer and having one end coupled to a threading screw dislocation contained in the silicon carbide epitaxial layer and the other end present in a surface of the silicon carbide epitaxial layer, wherein the basal plane dislocation extends in a direction having a slope of 20 degrees or more and 80 degrees or less with respect to a <11-20> direction in a {0001} basal plane, and wherein density of the basal plane dislocation is $0.05/cm^2$ or less.

The inventor of the present application found a basal plane dislocation having one end coupled to a threading screw dislocation and the other end that forms a surface of the silicon carbide layer in a silicon carbide epitaxial substrate including a silicon carbide epitaxial layer formed on a silicon carbide single-crystal substrate. The basal plane dislocation has a dislocation line that has a slop of 20 degrees or more and 80 degrees or less with respect to a <11-20> direction in the {0001} plane. According to the findings of the inventor of the present application, the basal plane dislocation is likely to occur in a silicon carbide single-crystal substrate having a principal surface inclined at an angle of more than 0 degrees and not less than 8 degrees with respect to a {0001} plane, and particularly having a diameter of 100 mm or larger, and further a diameter of 150 mm or larger. When such a basal plane dislocation is present, the basal plane dislocation increases, and the silicon carbide epitaxial substrate that contains many basal plane dislocations may be manufactured. When a semiconductor device is manufactured using a silicon carbide epitaxial substrate that contains many such basal plane dislocations, reliability of the manufactured semiconductor device may decrease.

Hence, in the silicon carbide epitaxial substrate, by controlling the number of the basal plane dislocations to one or more in the entire surface and the density to $0.05/cm^2$ or less, a decrease in reliability of a semiconductor device manufactured by using the silicon carbide epitaxial substrate can be inhibited.

Here, the number and density of the basal plane dislocation can be calculated by analyzing the entire surface of the silicon carbide epitaxial layer using a PL (photo Luminescence) imaging device and by dividing the detected number of the basal plane dislocations by the area of the surface of the silicon carbide epitaxial layer. For example, a PL imaging device PLIS-100 (made by PHOTON Design Corporation) can be used. Here, the entire surface described above does not contain a region that is not used for a semiconductor device. Here, the region that is not used for the semiconductor device means, for example, a region of 3 mm from the edge of the substrate.

[2] There is another basal plane dislocation extending in the <11-20> direction coupled to the other end of the basal plane dislocation.

[3] A diameter of the silicon carbide single-crystal substrate is set at 150 mm or larger.

[4] A method for manufacturing a silicon carbide semiconductor device includes a step of preparing a silicon carbide epitaxial substrate, and a step of processing a silicon carbide epitaxial substrate.

[Details of Embodiments of the Present Disclosure]

An embodiment of the present disclosure (which is hereinafter referred to as a "present embodiment") is described below with reference to the drawings, but the present disclosure is not limited to these illustrations.

[Silicon Carbide Epitaxial Substrate]

A silicon carbide epitaxial substrate 100 in the present disclosure is described below.

FIG. 1 is a cross-sectional view illustrating an example of a structure of the silicon carbide epitaxial substrate in the present embodiment. The silicon carbide epitaxial substrate in the present embodiment includes a silicon carbide single-crystal substrate 10 having a principal surface 10A inclined at an off angle θ with respect to a predetermined crystal plane, and a silicon carbide epitaxial layer 11 formed on the principal surface 10A of the silicon carbide single-crystal substrate 10. The predetermined crystal plane is preferably a (0001) plane or a (000-1) plane.

The silicon carbide epitaxial substrate 100 in the present embodiment includes a basal plane dislocation having one end coupled to a threading screw dislocation and the other end that forms a surface of the silicon carbide epitaxial substrate 100. The direction of the dislocation line of this basal plane dislocation has an angle of 20 degrees or more and 80 degrees or less with respect to a <11-20> direction in a {0001} basal plane. The number of the basal plane dislocations is one or more, and density of the dislocation is $0.05/cm^2$ or less.

In terms of reliability of semiconductor devices manufactured by using a silicon carbide epitaxial substrate, the density of the basal plane dislocation is preferred to be as low as possible, and ideally preferred to be 0 (zero). However, because making the basal plane dislocation 0 is quite difficult, the density of the basal plane dislocation is preferably $0.05/cm^2$ or less, and more preferably $0.03/cm^2$ or less.

[Basal Plane Dislocation]

Figure 2:
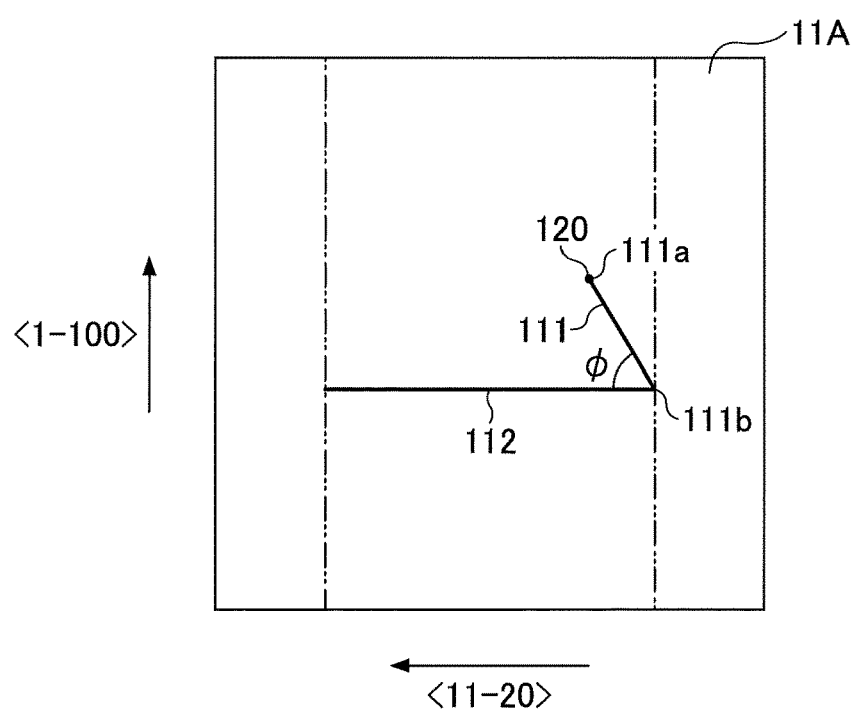
FIG. 2 is a top view schematically illustrating a basal plane dislocation having an end coupled to a threading screw dislocation and another basal plane dislocation coupled to the basal plane dislocation.
Figure 3:
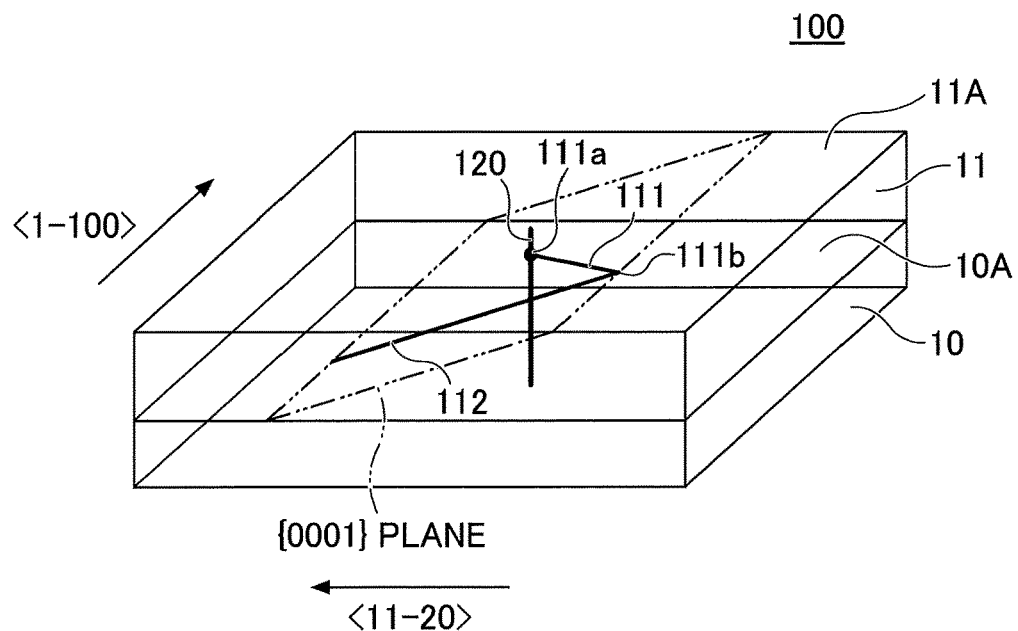
FIG. 3 is a perspective view (1) schematically illustrating a basal plane dislocation having an end coupled to a threading screw dislocation and another basal plane dislocation coupled to the basal plane dislocation.
Figure 4:
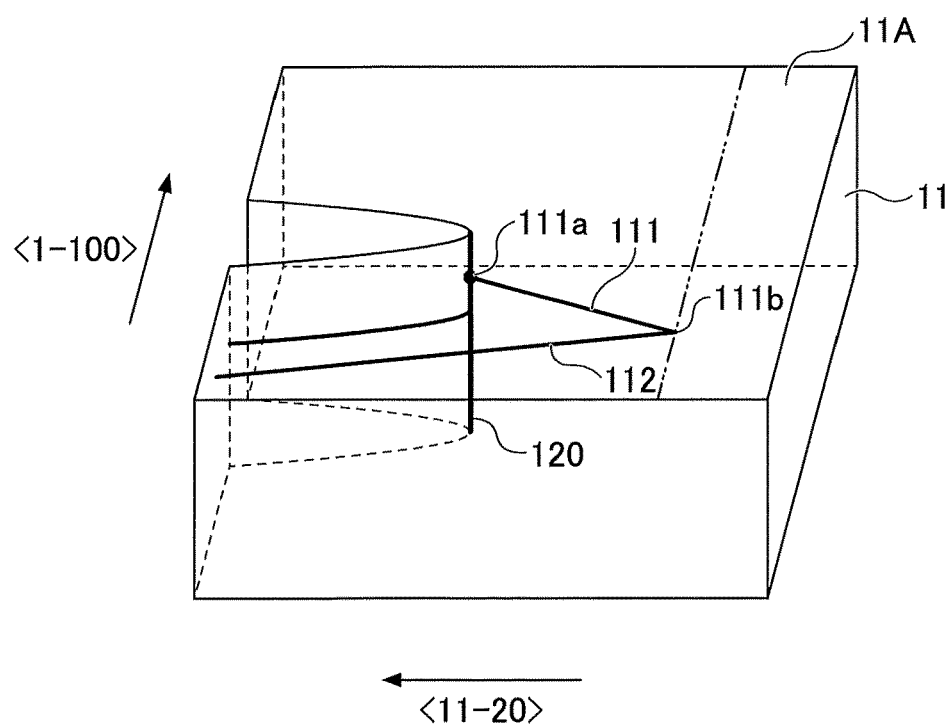
FIG. 4 is a perspective view (2) schematically illustrating a basal plane dislocation having an end coupled to a threading screw dislocation and another basal plane dislocation coupled to the basal plane dislocation.

The above-mentioned basal plane dislocation is described below with reference to FIG. 2 to FIG. 4. FIG. 2 is a top view of the silicon carbide epitaxial substrate 100; FIG. 3 is a perspective view; and FIG. 4 is a perspective view enlarging a main part. One end 111a of the above-mentioned basal plane dislocation 111 is connected to a threading screw dislocation 120, and the other end 111b forms a surface 11A of a silicon carbide epitaxial layer 11. This basal plane dislocation 111 has an angle φ of 20 degrees or more and 80 degrees or less with respect to the <11-20> direction in the {0001} basal plane.

In such a basal plane dislocation 111, the other end 111b is sometimes coupled to another basal plane dislocation 112. The basal plane dislocation 111 and the other basal plane dislocation 112 are found as a result of a research of the inventor of the present application.

[Mechanism of Dislocation Generation]

Next, a mechanism and the like of the generation of the basal plane dislocation 111 are described below based on FIG. 5 to FIG. 9.

Figure 5:
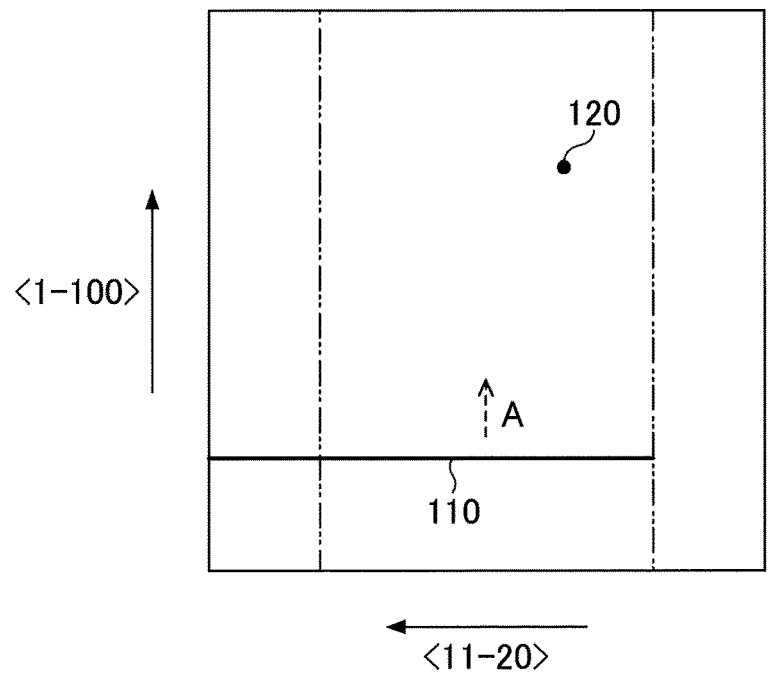
FIG. 5 is a top view (1) schematically illustrating a basal plane dislocation having an end coupled to a threading screw dislocation and a mechanism of generation of another basal plane dislocation.

The silicon carbide epitaxial substrate in the present embodiment is formed by depositing a silicon carbide epitaxial layer on a silicon carbide single-crystal substrate. The silicon carbide single-crystal substrate includes a basal plane dislocation and a threading screw dislocation. Hence, as illustrated in FIG. 5, the basal plane dislocation 110 and the threading screw dislocation 120 also occur in the silicon carbide epitaxial layer formed on the silicon carbide single-crystal substrate due to a part of the basal plane dislocation and the threading screw dislocation in the silicon carbide epitaxial substrate.

Figure 6:
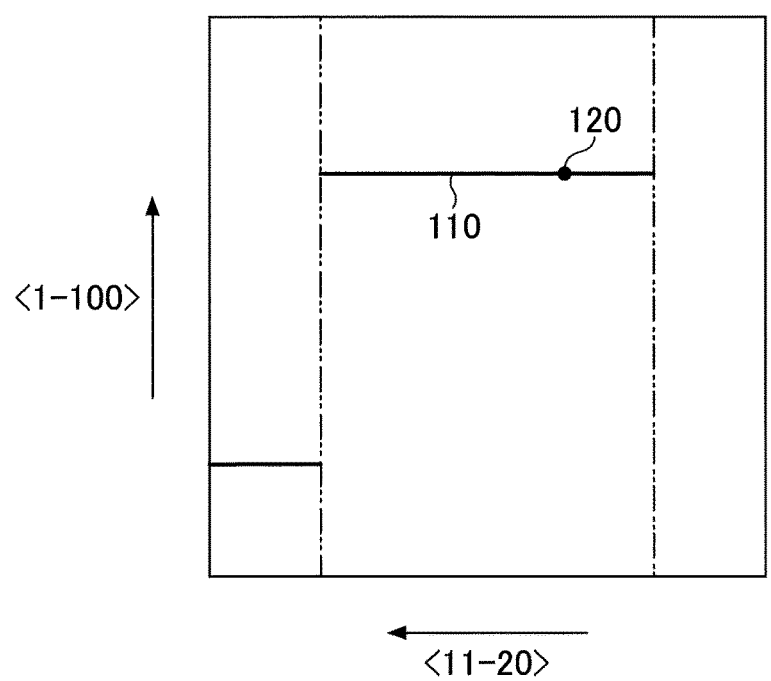
FIG. 6 is a top view (2) schematically illustrating a basal plane dislocation having an end coupled to a threading screw dislocation and a mechanism of generation of another basal plane dislocation.

The basal plane dislocation 110 generated in the silicon carbide epitaxial layer can slip and move in the <1-100> direction in the {0001} plane. Thus, although the basal plane dislocation 110 slips and moves in a direction shown by a broken line arrow A, as illustrated in FIG. 6, the slip movement of the basal plane dislocation 110 stops at a position where the basal plane dislocation 110 collides with the threading screw dislocation 120.

Figure 7:
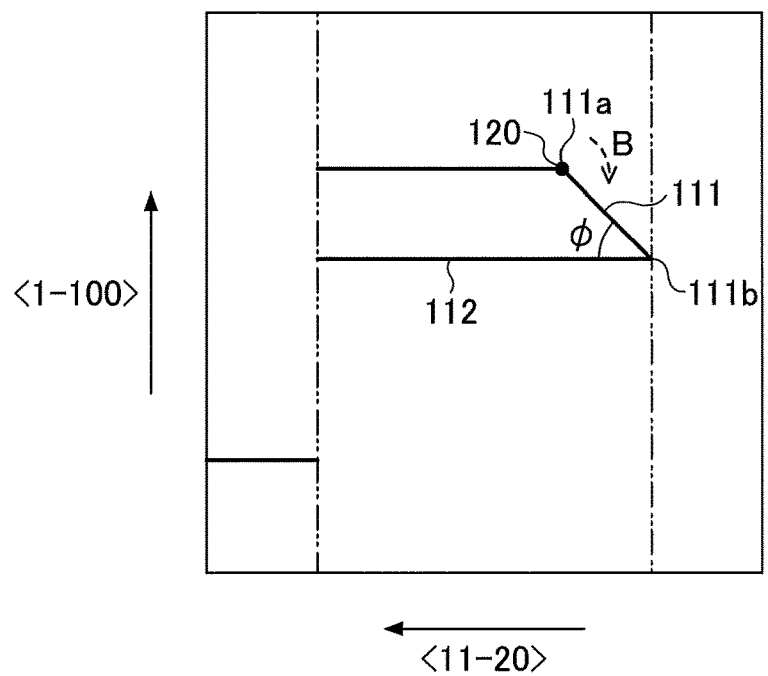
FIG. 7 is a top view (3) schematically illustrating a basal plane dislocation having an end coupled to a threading screw dislocation and a mechanism of generation of another basal plane dislocation.

Subsequently, as illustrated in FIG. 7, a portion between the threading screw dislocation 120 of the basal plane dislocation 110 and the silicon carbide epitaxial layer, as shown by a broken line arrow B, moves until the angle φ with respect to the <11-20> direction becomes 20 degrees or more and 80 degrees or less on the {0001} plane, thereby forming the basal plane dislocation 111. One end 111a of the basal plane dislocation 111 is connected to the threading screw dislocation 120, and the other end 111b forms the surface of the silicon carbide epitaxial layer. That is, the other end 111b of the basal plane dislocation 111 reaches the surface of the silicon carbide epitaxial layer from the threading screw dislocation 120, and is present so as to be contained in the surface. On this occasion, another basal plane dislocation 112 occurs from the other end 111b of the basal plane dislocation 111. The basal plane dislocation 111 and the other basal plane dislocation 112 occur due to the above-mentioned mechanism.

Figure 8:
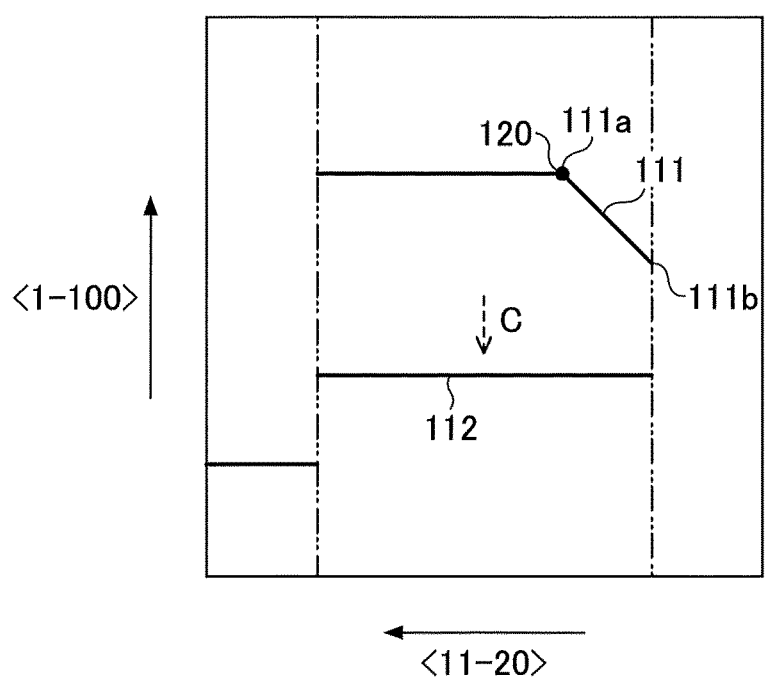
FIG. 8 is a top view (4) schematically illustrating a basal plane dislocation having an end coupled to a threading screw dislocation and a mechanism of generation of another basal plane dislocation.
Figure 9:
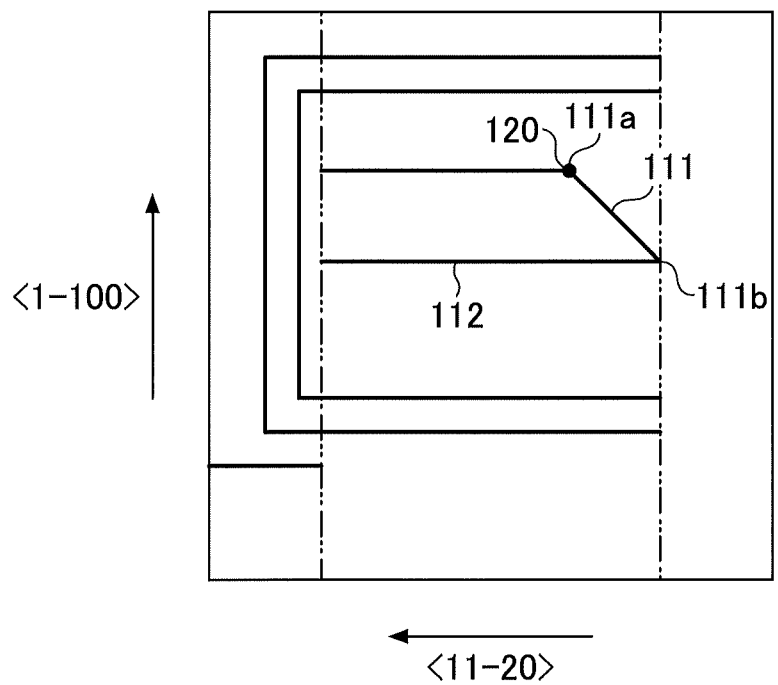
FIG. 9 is a top view (5) schematically illustrating a basal plane dislocation having an end coupled to a threading screw dislocation and a mechanism of generation of another basal plane dislocation.

Subsequently, as illustrated in FIG. 8, the other basal plane dislocation 112, as shown by a broken line arrow C, departs from the other end 111b of the basal plane dislocation 111, slips on the {0001} plane, and moves in the <1-100> direction. Then, another basal plane dislocation 112 occurs from the other end 111b of the basal plane dislocation 111 again, and the basal plane dislocation departs from the other end 111b of the basal plane dislocation 111, which is repeated. Thus, as illustrated in FIG. 9, many basal plane dislocations occur from the single basal plane dislocation 111.

Figure 10:
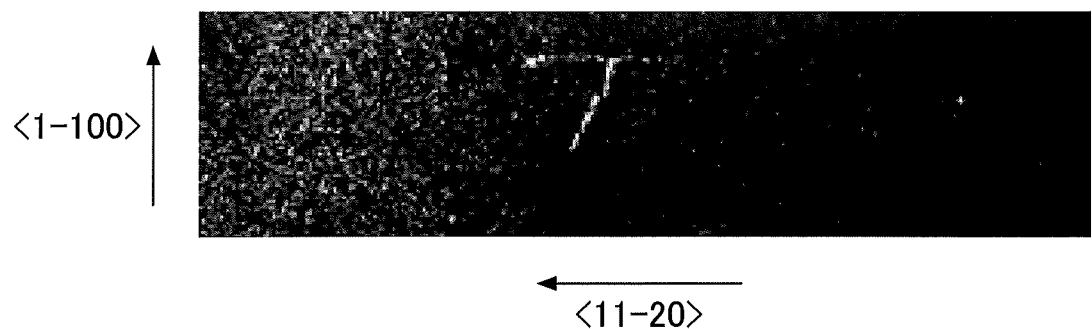
FIG. 10 is a PL image (Photoluminescence) (1) of a basal plane dislocation having an end coupled to a threading screw dislocation and another basal plane dislocation.
Figure 11:
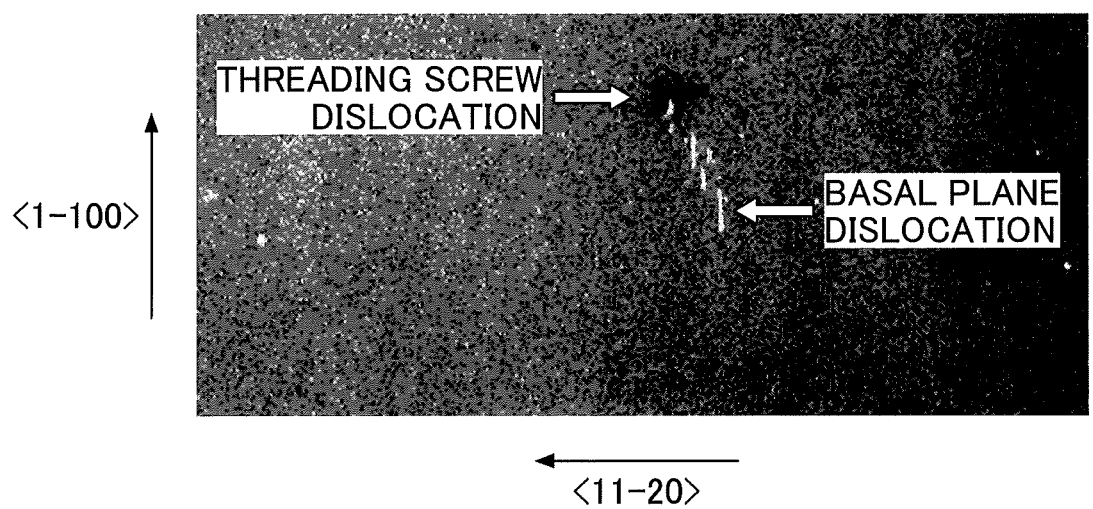
FIG. 11 is a PL image (Photoluminescence) (2) of a basal plane dislocation having an end coupled to a threading screw dislocation and another basal plane dislocation.

FIG. 10 and FIG. 11 are PL images (PL imaging pictures) of a silicon carbide epitaxial substrate. Here, a PL imaging device PLIS-100 (made by PHOTON Design Corporation) was used to measure the PL images. In the measurement of the PL images, a mercury xenon lamp was used as an excitation light source in room temperature, and light having passed through a bandpass filter of wavelength of 313 nm was emitted to a silicon carbide epitaxial substrate. The PL images are ones obtained by light that occurred from the silicon carbide epitaxial substrate and passed through a filter that allows light having wavelength of 750 nm or longer. The PL images obtained in this manner allow the dislocation on the silicon carbide epitaxial layer to be observed, but do not allow the dislocation in the silicon carbide epitaxial substrate to be observed. Thus, the dislocations shown in FIG. 10 and FIG. 11 are ones in the silicon carbide epitaxial layer. FIG. 10 shows a state of a basal plane dislocation 111 extending obliquely being coupled with another basal plane dislocation, and FIG. 11 shows a state of a basal plane dislocation 111 being formed in a zigzag shape in directions of <11-20> and <1-100>. In the PL image in FIG. 11, a portion in the <1-100> direction among the zigzag basal plane dislocation is shown by a light line.

In the meantime, when the mechanism of generation of the above-mentioned basal plane dislocation is investigated, the above-mentioned basal plane dislocation is considered to be generated while the silicon carbide epitaxial substrate is cooled after the silicon carbide epitaxial layer is deposited, not during deposition of the silicon carbide epitaxial layer. That is, the slip movement of the basal plane dislocation 110 illustrated in FIG. 6 to FIG. 9 is considered to be generated at a relatively high temperature, specifically at a temperature of 1000° C. or higher, and is considered to be caused by a stress generated in the silicon carbide epitaxial substrate. In the silicon carbide epitaxial substrate, when a difference in temperature distribution of the silicon carbide substrate is great, the stress generated in the silicon carbide epitaxial substrate becomes great. On the other hand, in processes for manufacturing a silicon carbide epitaxial substrate, a process of cooling the silicon carbide epitaxial substrate is cited as a process of increasing the difference of the temperature distribution in the silicon carbide epitaxial substrate. In the cooling process, a stress is likely to particularly occur in the silicon carbide epitaxial substrate.

In other words, while deposition of the silicon carbide epitaxial layer is performed at a very high temperature around 1600° C., in this case, uniformity of the temperature distribution is relatively high. After the deposition of the silicon carbide epitaxial layer, the whole is not cooled at a uniform temperature, and variation in temperature distribution is likely to occur. Thus, in the silicon carbide epitaxial substrate, if a period of time when the temperature distribution varies is long, along with this, the basal plane dislocation 111 is considered to occur, and the number of the other basal plane dislocations 112 is considered to increase. Moreover, according to findings of the inventor of the present application, although the basal plane dislocation 111 is scarcely found in a substrate having a small size of the silicon carbide single-crystal substrate 10, the basal plane dislocation 111 significantly occurs in a substrate having a large size. For example, when the size of the silicon carbide single-crystal substrate 10 is 100 mm or larger, and further, when the size is 150 mm (e.g., 6 inches) or larger, it is confirmed that the basal plane dislocations significantly occurs. This seems to be because the difference in temperature distribution increases as an area of the silicon carbide single-crystal substrate 10 increases, and because the stress is likely to occur along with the increase in temperature distribution.

Accordingly, the silicon carbide epitaxial substrate in the present embodiment is obtained by rapidly cooling the silicon carbide epitaxial substrate while blowing a gas thereto after the silicon carbide epitaxial layer is deposited thereon. In other words, by rapidly cooling the silicon carbide epitaxial layer after being deposited, a period of time until the temperature becomes 1000° C. or lower where the slip movement of the basal plane dislocation and the increase of the basal plane dislocation are unlikely to occur is shortened. Thus, a silicon carbide epitaxial substrate including a less basal plane dislocation 111 and another less basal plane dislocation 112 can be manufactured.

[Film Deposition Apparatus]

Figure 12:
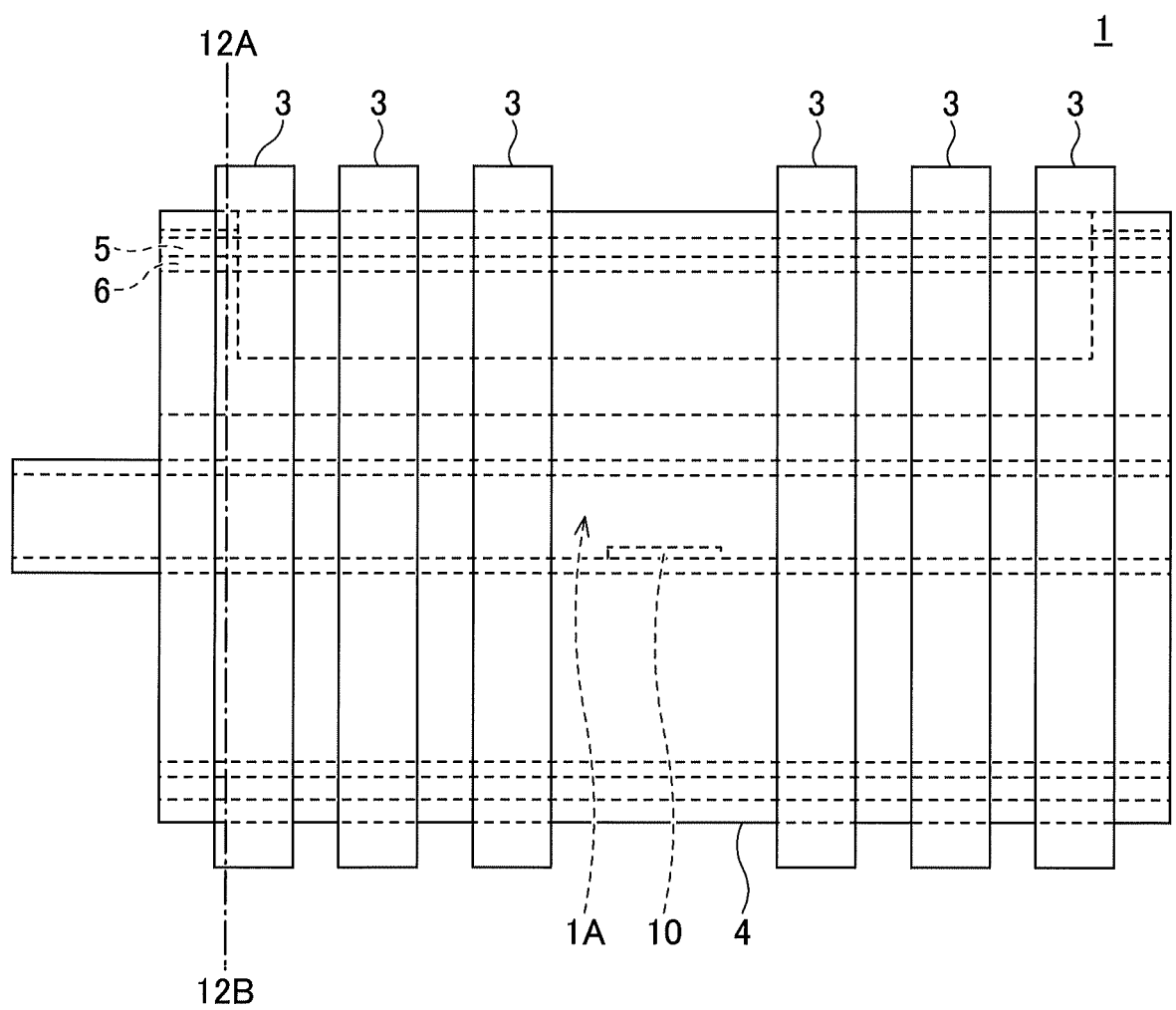
FIG. 12 is a lateral view schematically illustrating an example of a configuration of a film deposition apparatus.
Figure 13:
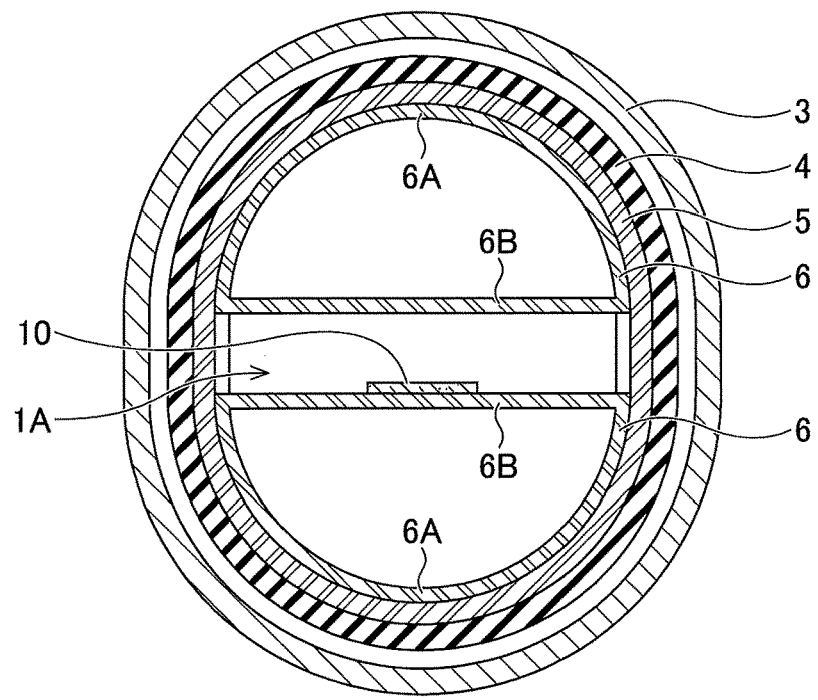
FIG. 13 is a lateral view schematically illustrating an example of a configuration of a film deposition apparatus.

Next, a method for manufacturing a silicon carbide epitaxial substrate in the present embodiment is described below. To begin with, a film deposition apparatus to deposit a silicon carbide epitaxial layer in the silicon carbide epitaxial substrate is described below. FIG. 12 is a side view schematically illustrating an example of a configuration of a film deposition apparatus. Moreover, FIG. 13 is a cross-sectional view taken along a dashed-dotted line 12A-12B. The film deposition apparatus 1 illustrated in FIG. 12 and FIG. 13 is a lateral type hot wall CVD (Chemical Vapor Deposition) apparatus. As illustrated in FIG. 12, the film deposition apparatus 1 includes a heating element 6, a heat insulator 5, a quartz tube 4, and an induction heating coil 3. The heating element 6 is, for example, made of carbon. As illustrated in FIG. 13, two heating elements 6 are provided in the film deposition apparatus 1, and each of the heating elements 6 has a hollow structure formed into a half cylinder containing a curved part 6A and a flat part 6B. The two flat parts 6B are arranged to face each other, and a space surrounded by the two flat parts 6B forms a chamber 1A in which a silicon carbide single-crystal substrate 10 is loaded. The chamber 1A is referred to as a "gas flow channel."

The heat insulator 5 is arranged so as to surround outer circumferential parts of the heating elements 6. The chamber 1A is insulated from the outside of the film deposition apparatus 1 by the heat insulator 5. The quartz tube 4 is arranged so as to surround outer circumferential parts of the heat insulators 5. The induction heating coil 3 is wound around the outer circumferential part of the quartz tube 4. In the film deposition apparatus 1, the heating elements 6 are inductively heated by supplying an alternate current to the induction heating coil 3, and a temperature in the chamber 1A can be controlled. On this occasion, the quartz tube 4 is hardly heated because the heat insulators 5 insulate heat.

[Method for Manufacturing Silicon Carbide Epitaxial Substrate]

Next, a method for manufacturing a silicon carbide epitaxial substrate in the present embodiment is described below.

Figure 14:
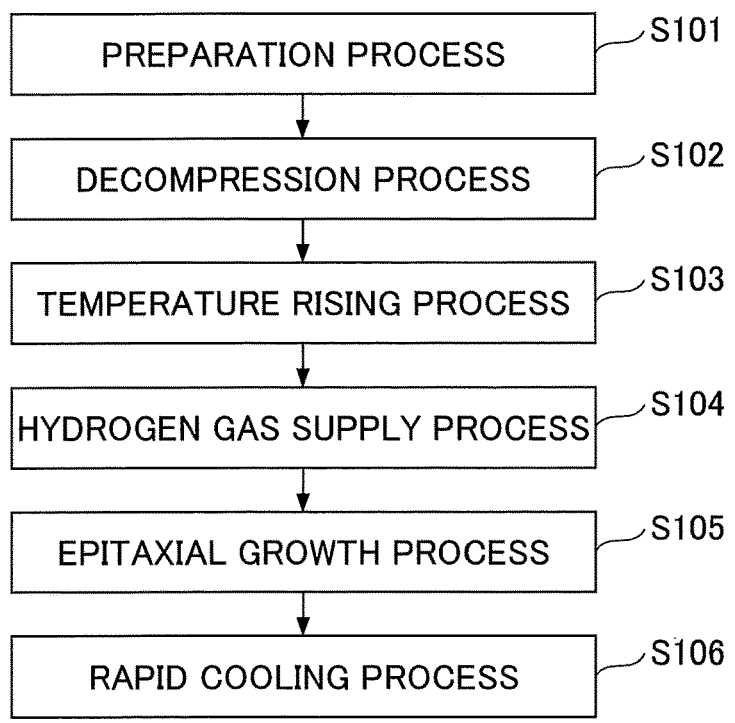
FIG. 14 is a flowchart illustrating an outline of a method for manufacturing a silicon carbide epitaxial substrate according to an embodiment of the present disclosure.

FIG. 14 is a flowchart illustrating an outline of the method for manufacturing the silicon carbide epitaxial substrate of the present embodiment. As illustrated in FIG. 14, the method for manufacturing the silicon carbide epitaxial substrate of the present embodiment includes a preparation process (S101), a decompression process (S102), a temperature rising process (S103), a hydrogen gas supply process (S104), an epitaxial growth process (S105), and a rapid cooling process (S106). In the present embodiment, by performing the rapid cooling process (S106) after the epitaxial growth process (S105), the basal plane dislocation in the silicon carbide single-crystal substrate 10 can be decreased. Hereinafter, each process is described.

In the preparation process (S101), a silicon carbide single-crystal substrate 10 is manufactured by slicing an ingot made of, for example, a silicon carbide single crystal. For example, a wire saw is used for the slice. A polytype of silicon carbide is preferably a 4H. This is because the 4H polytype excels the other polytypes in electron mobility, dielectric breakdown strength and the like. The diameter of the silicon carbide single-crystal substrate 10 is 100 mm or larger, and is preferably 150 mm or larger (e.g., 6 inches or larger). The large the diameter becomes, the more efficiently the manufacturing cost decreases.

The silicon carbide single-crystal substrate 10 includes a principal surface 10A on which a silicon carbide epitaxial layer 11 is to be grown later. The silicon carbide single-crystal substrate 10 has an off angle that is greater than 0 degrees and not more than 8 degrees. In other words, the principal surface 10A is a surface inclined at an off angle θ that is greater than 0 degrees and not more than 8 degrees with respect to a predetermined crystal plane. By introducing the off angle θ into the silicon carbide single-crystal substrate 10, when the silicon carbide epitaxial layer 11 is grown by a CVD method, a lateral directional growth from an atomic step that appears on the principal surface 10A, so-called a "step flow growth," is induced. Thus, a single crystal grows while inheriting a polytype of the silicon carbide single-crystal substrate 10, thereby inhibiting a different type of polytype from being mixed into. Here, the predetermined crystal plane is preferably a (0001) plane or a (000-1) plane. In other words, the predetermined crystal plane is preferably a {0001} plane. A direction in which an off angle is provided is a <11-20> direction. The off angle θ is more preferably set to 2 degrees or more and 7 degrees or less, more and more preferably to 3 degrees or more and 6 degrees or less, and most preferably to 3 degrees or more and 5 degrees or less. By setting the off angle in such a range, a balance between inhibiting a different type of polytype and a growing speed can be maintained. Subsequent processes are performed in the film deposition apparatus 1.

In the decompression process (S102), as illustrated in FIG. 12 and FIG. 13, the silicon carbide single-crystal substrate 10 is loaded in the chamber 1A of the film deposition apparatus 1, and the pressure in the chamber 1A is decreased. The silicon carbide single-crystal substrate 10 is placed on a susceptor that is not depicted in the drawing in the chamber 1A. The susceptor may be coated with a SiC coating and the like.

Figure 15:
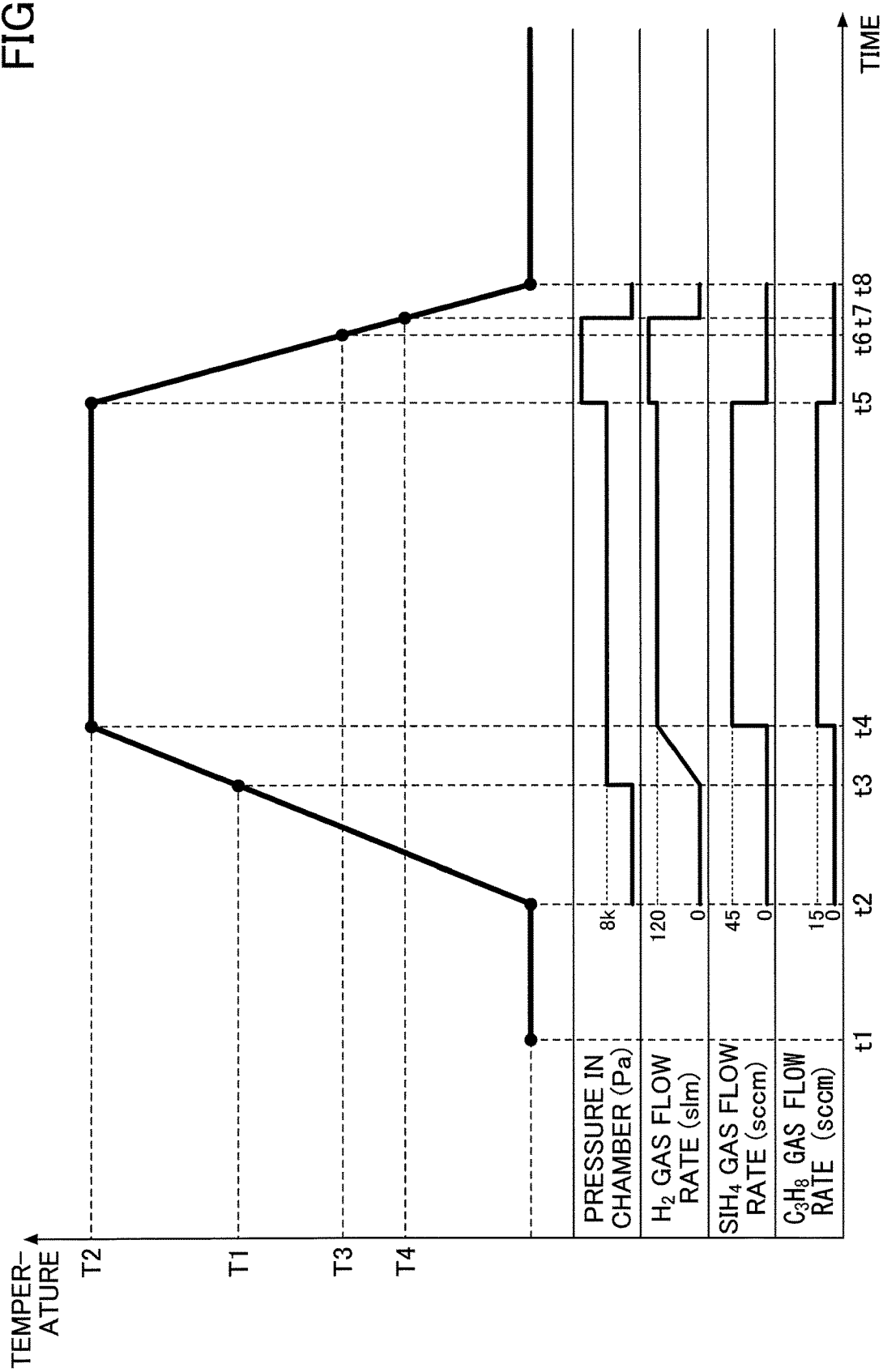
FIG. 15 is a timing chart illustrating an example of temperature control and gas flow rate control in a film deposition apparatus.

FIG. 15 is a timing chart illustrating control of a temperature and a gas flow rate in the chamber 1A after the decompression process (S102). In FIG. 15, the decompression process (S102) corresponds to a period from time t1 when the decompression of the chamber 1A starts to time t2 when the pressure in the chamber 1A reaches a targeted value after the silicon carbide single-crystal substrate 10 is loaded in the chamber 1A. The targeted value of the pressure in the decompression process (S102) is, for example, about $1*10^{-6}$ Pa.

In the temperature rising process (S103), the temperature in the chamber 1A of the film deposition apparatus 1 is heated to a second temperature T2. In the temperature rising process (S103), after the temperature passes a first temperature T1 that is lower than the second temperature T2, the temperature reaches the second temperature T2. As illustrated in FIG. 15, the temperature rising starts from time t2; the temperature in the chamber 1A reaches the first temperature T1 at time t3; and the temperature in the chamber 1A further reaches the second temperature T2 at time t4. The first temperature T1 is, for example, 1100° C.

Moreover, the second temperature T2 is preferably 1500° C. or more and 1700° C. or less. When the second temperature T2 is below 1500° C., it may be difficult to uniformly grow a single crystal in an epitaxial growth process (S105) that is described later, and the growing speed may decrease. Furthermore, when the second temperature T2 exceeds 1700° C., an etching action by hydrogen gas becomes intense, and the growing speed may further decrease. The second temperature T2 is more preferably 1520° C. or more and 1680° C. or less, and is much more preferably 1550° C. or more and 1650° C. or less. In the present embodiment, the second temperature T2 is 1630° C.

In the hydrogen gas supply process (S104), as illustrated in FIG. 15, hydrogen ($H_2$) gas is supplied into the chamber 1A from time t3 when the temperature in the chamber 1A reaches the first temperature T1, and the pressure in the chamber 1A is set at a predetermined pressure, for example, 8 kPa. The supply of hydrogen gas starts from time t3, and a flow rate of hydrogen gas is gradually increased so that the flow rate of hydrogen gas becomes 120 slm at time t4. Here, even in the hydrogen supply process (S104), the temperature rising process (S103) is continued until the temperature in the chamber 1A of the film deposition apparatus 1 reaches the second temperature T2. After the temperature in the chamber 1A of the film deposition apparatus 1 reaches the second temperature T2, the epitaxial growth process (S105) is performed.

In the epitaxial growth process (S105), a hydrocarbon gas and silane ($SiH_4$) gas are supplied into the chamber 1A of the film deposition apparatus 1 with hydrogen gas. The predetermined pressure in the chamber 1A in the epitaxial growth process (S105) is, for example, 8 kPa. Thus, the silicon carbide epitaxial layer 11 can be grown on the principal surface 10A of the silicon carbide single-crystal substrate 10.

Methane ($Ch_4$) gas, ethane ($C_2H_6$) gas, propane ($C_3H_8$) gas, butane ($C_4H_{10}$) gas, acetylene ($C_2H_2$) gas and the like can be used as the hydrocarbon gas. Among these hydrocarbon gases, a single type of gas may be used alone, or a mixed gas formed by combining two types of gases or more may be used. In other words, the hydrocarbon gas preferably contains one or more selected from the group consisting of methane gas, ethane gas, propane gas, butane gas and acetylene gas. A flow rate of the hydrocarbon gas is preferably 5 sccm or more and 30 sccm or less. In the present embodiment, for example, propane gas is supplied as the hydrocarbon gas at 15 sccm.

Moreover, the flow rate of silane gas is not specifically limited, but the flow rate of the silane gas is preferably adjusted such that a ratio (C/Si) of a number of carbon (C) atoms contained in the hydrocarbon gas to a number of silicon (Si) atoms contained in silane gas becomes 0.5 or more and 2.0 or less. This is because SiC having an appropriate stoichiometric mixture ratio is grown by an epitaxial growth. In the present embodiment, for example, silane gas is supplied at 45 sccm.

In the epitaxial process (S105), nitrogen ($N_2$) and the like may be supplied as a dopant. The epitaxial growth process (S105) is performed until time t5 while adjusting to the targeted thickness of the silicon carbide epitaxial layer 11.

After completing the epitaxial growth process (S105), the rapid cooling process (S106) is performed. In the rapid cooling process (S106), the silicon carbide epitaxial substrate is rapidly cooled by blowing hydrogen or argon (Ar) to the silicon carbide epitaxial substrate after the epitaxial growth is completed. In the present embodiment, the flow rate of hydrogen gas is increased, and hydrogen gas is blown to the silicon carbide epitaxial substrate after the epitaxial growth is completed. On this occasion, the pressure in the chamber 1A may exceed 8 kPa. In the present embodiment, a third temperature T3 at time t6 when ten minutes have passed since time t5 can be set at about 700° C. Hence, after the epitaxial growth, because the temperature can be set at a temperature of 1000° C. or lower in a short period of time of ten minutes or shorter, the slip movement of the basal plane dislocation is unlikely to occur. Thus, in the present embodiment, density of the basal plane dislocation 111 in the silicon carbide epitaxial substrate can be made 0.05/cm² or lower.

Subsequently, the silicon carbide epitaxial substrate is further cooled, and the supply of hydrogen gas is stopped at time t7 when the temperature becomes 600° C. Then, after the silicon carbide epitaxial substrate is cooled until time t7 when the silicon carbide epitaxial substrate reaches a temperature at which the formed silicon carbide epitaxial substrate can be taken out of the chamber 1A, the inside of the chamber 1A is opened to atmospheric pressure so that the inside of the chamber 1A returns to atmospheric pressure, and the silicon carbide epitaxial substrate 100 is taken out of the chamber 1A.

The silicon carbide epitaxial substrate 100 in the present embodiment can be manufactured by the above-mentioned processes.

Figure 16:
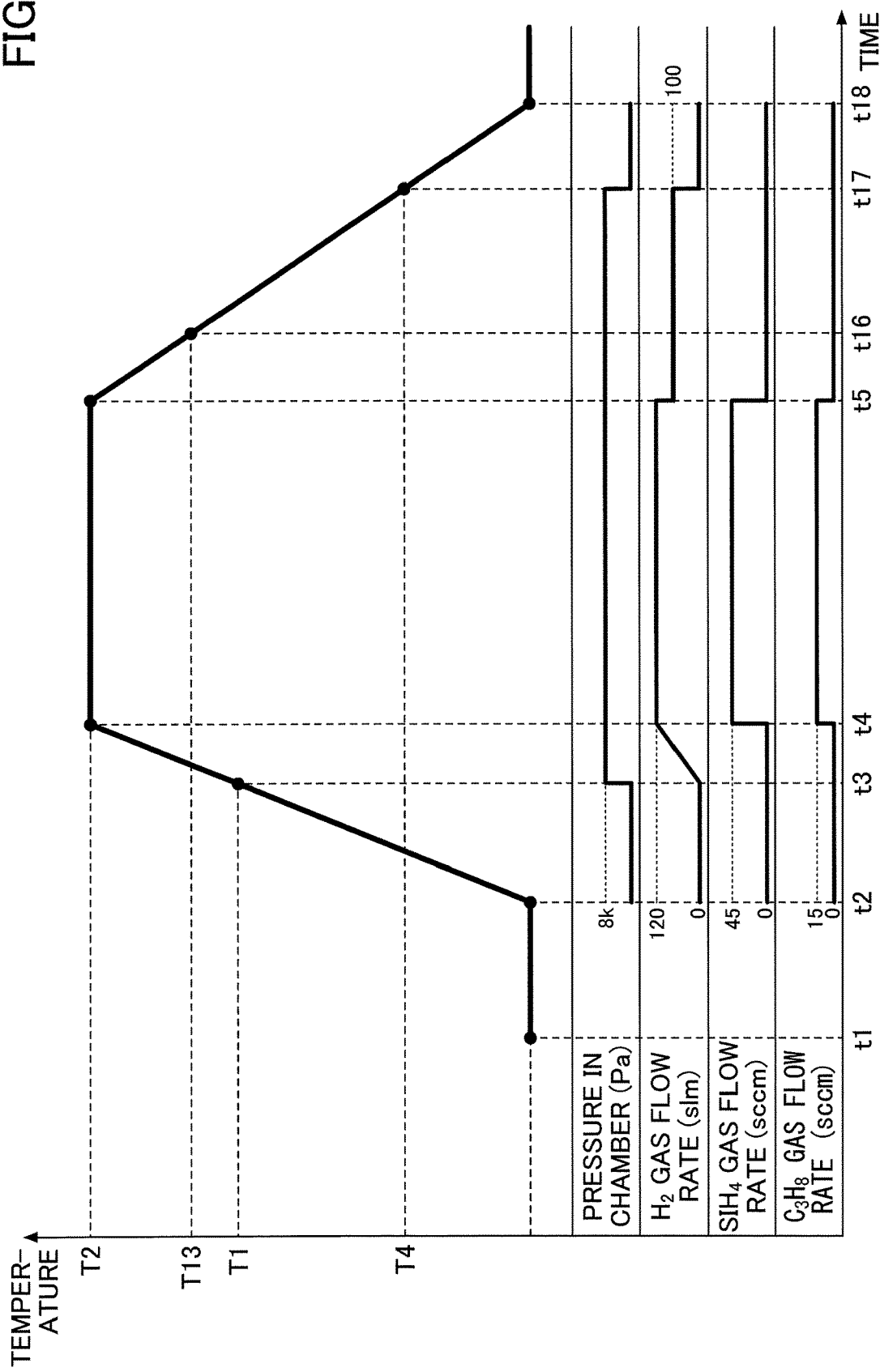
FIG. 16 is a timing chart illustrating an example of temperature control and gas flow rate control in a film deposition apparatus of a method for manufacturing a silicon carbide epitaxial substrate without a rapid cooling process.

Next, for comparison with the present embodiment, a case of cooling a substrate on which an epitaxial growth has been finished without performing the rapid cooling process (S106), which differs from the manufacturing method of the present embodiment, is described below. A timing chart showing control of a temperature in the chamber 1A and a gas flow rate in and after the decompression process in this case is illustrated in FIG. 16. A different point from the manufacturing method of the present embodiment illustrated in FIG. 15 is that the cooling is ordinarily performed without rapidly cooling the silicon carbide epitaxial substrate on which the epitaxial growth has been finished after time t5 when the epitaxial process has finished. Specifically, in the timing chart shown in FIG. 16, the cooling is performed while the flow rate of hydrogen gas is set at 100 slm from time t5 at which the epitaxial growth has finished. The predetermined pressure in the chamber 1A on this occasion is, for example, 8 kPa. In this case, a temperature at time t16 when ten minutes has passed since time t5 is about 1200° C., and is not less than 1000° C. Thus, the basal plane dislocation slips and moves at time 16, and the basal plane dislocation 111 and the other basal plane dislocation 112 are presumed to increase.

Subsequently, the cooling is further performed, and the supply of hydrogen gas is stopped at time t17 when the temperature reaches 600° C. Then, after cooling the silicon carbide epitaxial substrate until time t18 at which the silicon carbide epitaxial substrate can be taken out, the inside of the chamber 1A is open to the atmosphere so that the pressure in the chamber 1A returns to atmospheric pressure, and the silicon carbide epitaxial substrate is taken out of the chamber 1A.

Figure 17:
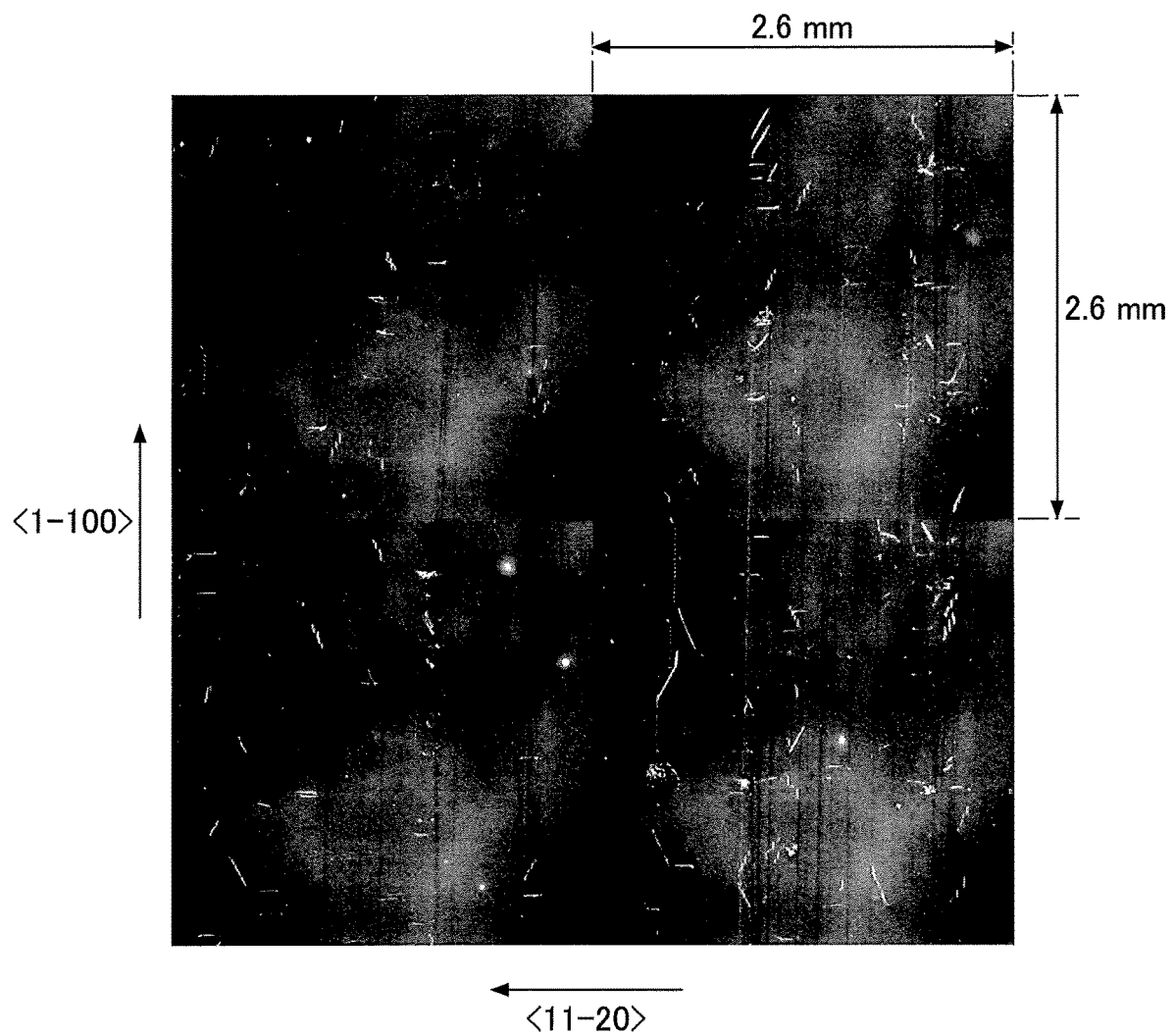
FIG. 17 is a PL image of a dislocation in a silicon carbide epitaxial substrate manufactured by a method for manufacturing a silicon carbide epitaxial substrate without a rapid cooling process.

A PL image of the silicon carbide epitaxial substrate manufactured by the above-mentioned manufacturing method of the timing chart illustrated in FIG. 16 is illustrated in FIG. 17. In the manufacturing method illustrated in FIG. 16, because the temperature is about 1200° C., which is not less than 1000° C., even when ten minutes have passed since the epitaxial growth finishes, the basal plane dislocation slips and moves, and very many dislocations (about 40/cm$^2$) are confirmed as shown in FIG. 17.

According to the method for manufacturing the silicon carbide epitaxial substrate in the present embodiment, by rapidly cooling the silicon carbide epitaxial substrate after the epitaxial growth, the temperature can be decreased to 1000° C. or lower at which the basal plane dislocation is unlikely to slip and move in a short period of time. Thus, the basal plane dislocation can be reduced more than the silicon carbide epitaxial substrate shown in FIG. 17.

[Method for Manufacturing Silicon Carbide Semiconductor Device]

Next, a method for manufacturing a silicon carbide semiconductor device 300 according to the present embodiment is described below.

Figure 18:
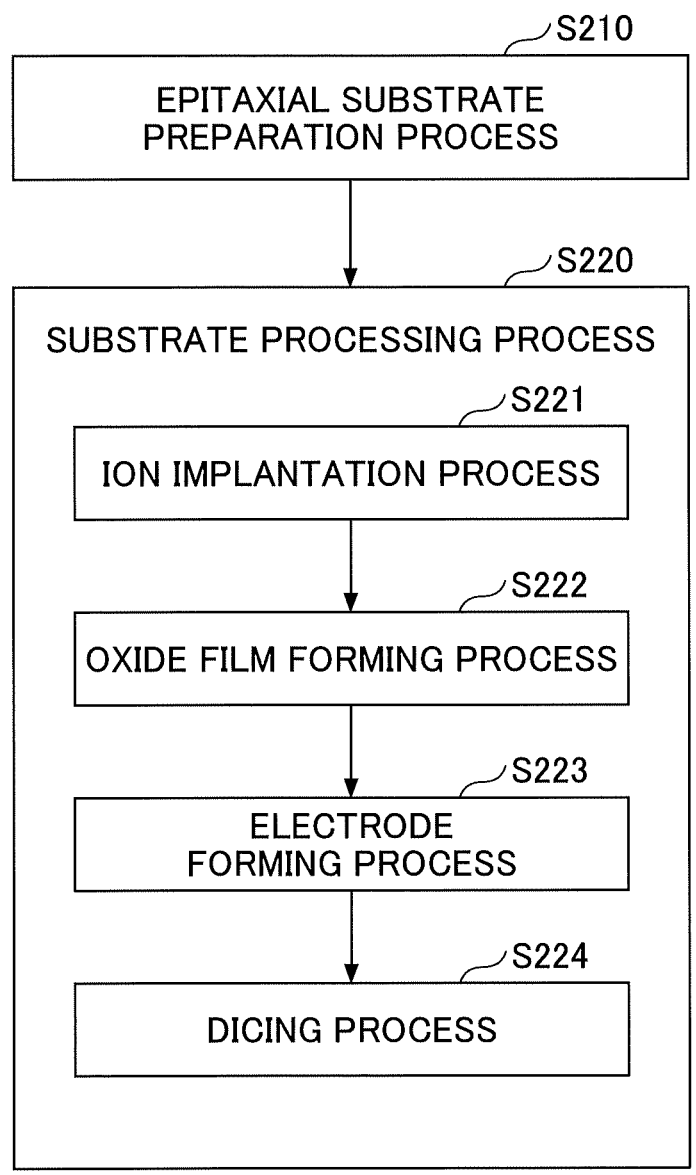
FIG. 18 is a flowchart illustrating an outline of a method for manufacturing a silicon carbide semiconductor device according to an embodiment of the present disclosure.

The method for manufacturing the silicon carbide semiconductor device according to the present embodiment mainly includes an epitaxial substrate preparation process (S210; FIG. 18), and a substrate processing process (S220: FIG. 18).

To begin with, the silicon carbide epitaxial substrate preparation process (S210: FIG. 18) is performed. Specifically, a silicon carbide epitaxial substrate is prepared by the above-mentioned method for manufacturing the silicon carbide epitaxial substrate.

Next, the substrate processing process (S220: FIG. 18) is performed. Specifically, by processing the silicon carbide epitaxial substrate, a silicon carbide semiconductor device is manufactured. In the "processing," for example, a variety of processing such as an ion implantation, a thermal treatment, an etching, an oxide film formation, an electrode formation and dicing is included. In other words, the substrate processing step may include at least any processing of the ion implantation, the thermal treatment, the etching, the oxide film formation, the electrode formation and the dicing.

A method for manufacturing a MOSFET (Metal Oxide Semiconductor Field Effect Transistor), which is an example of the silicon carbide semiconductor device, is described below. The substrate processing process (S220: FIG. 18) includes an ion implantation process (S221: FIG. 18), an oxide film forming process (S222, FIG. 18), an electrode forming process (S223: FIG. 18) and a dicing process (S224: FIG. 18).

Figure 19:
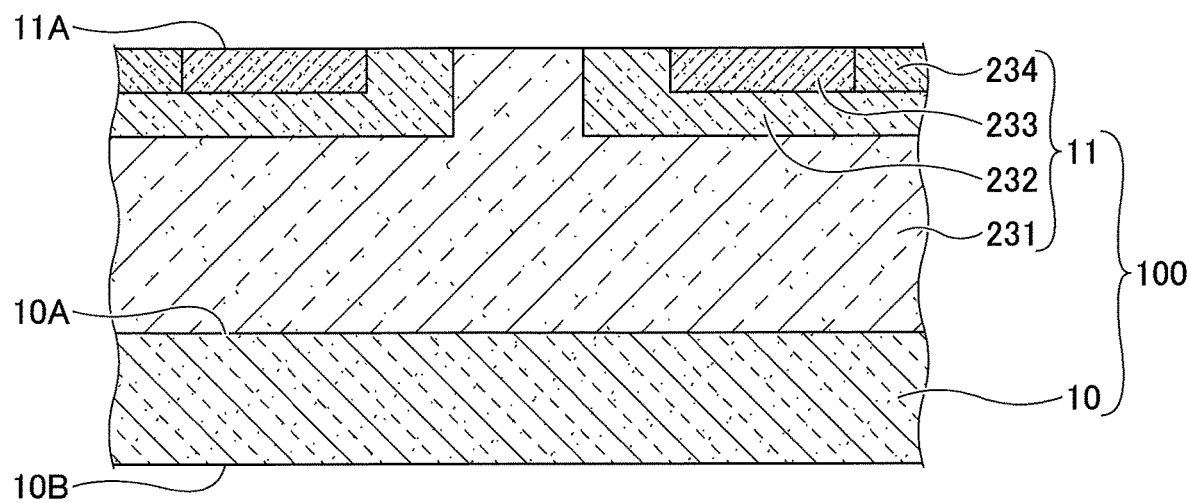
FIG. 19 is a process chart (1) of a method for manufacturing a silicon carbide semiconductor device according to an embodiment of the present disclosure.

To begin with, the ion implantation process (S221: FIG. 18) is performed. For example, p-type impurities such as aluminum (Al) are injected. Thus, a body region 232 having a p-type conductivity type is formed. Next, n-type impurities such as phosphorus (P) are injected to a predetermined position in the body region 232. Thus, a source region 233 having an n-type conductivity type is formed. Next, the p-type impurities such as aluminum are injected to a predetermined position of the body region 232. Thus, a contact region 234 having a p-type conductivity type is formed (see FIG. 19).

In the silicon carbide epitaxial layer 11, part other than the body region 232, the source region 233 and the contact region 234 becomes a drift region 231. The source region 233 is separated from the drift region 231 by the body region 232. The ion implantation may be performed by heating the silicon carbide epitaxial substrate 100 at about 300° C. to about 600° C. After the ion implantation, active annealing is performed on the silicon carbide epitaxial substrate 100. The impurities injected into the silicon carbide epitaxial layer 11 are activated by the active annealing, and a carrier is generated in each region. An atmosphere of the active annealing may be an argon (Ar) atmosphere, for example. A temperature of the active annealing may be about 1800° C., for example. A period of time for the active annealing may be about 30 minutes, for example.

Figure 20:
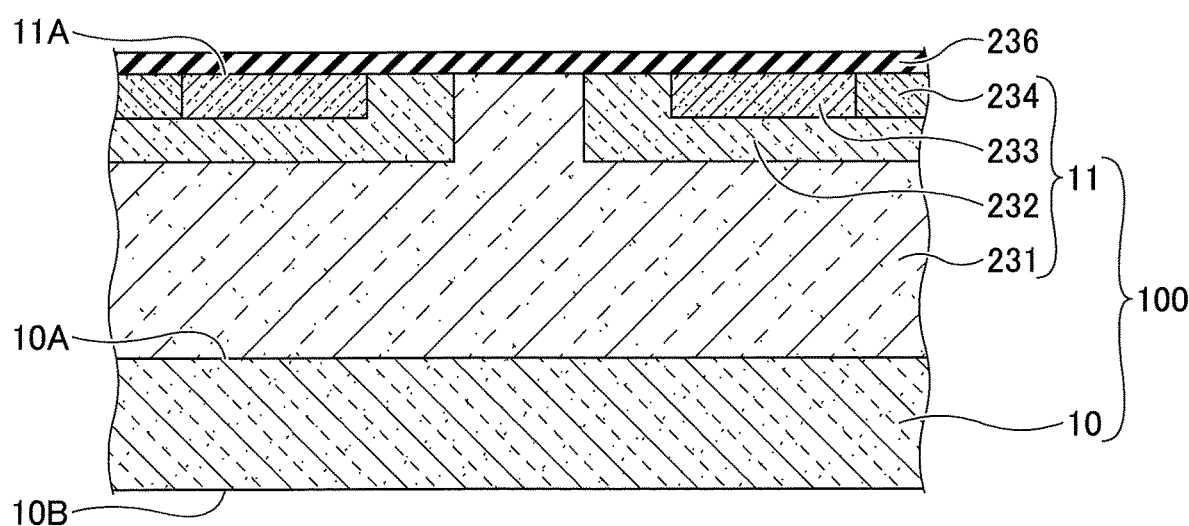
FIG. 20 is a process chart (2) of a method for manufacturing a silicon carbide semiconductor device according to an embodiment of the present disclosure.

Next, the oxide film forming process (S222: FIG. 18) is performed. For example, by heating the silicon carbide epitaxial substrate 100 in an atmosphere containing oxygen, an oxide film 236 is formed on a surface 11A (see FIG. 20). The oxide film 236 is, for example, made of silicon dioxide (SiO$_2$) and the like. The oxide film 236 serves as a gate insulating film. The temperature of the thermal oxidation process may be, for example, about 1300° C. The period of time for the thermal oxidation process may be, for example, about 30 minutes.

After the oxide film 236 is formed, a further thermal treatment may be performed in a nitrogen environment. For example, the thermal treatment may be performed in an atmosphere such as nitric monoxide (NO) and nitrous oxide (N$_2$O) at 1100° C. for about one hour. Furthermore, subsequently, a thermal treatment may be performed in an argon atmosphere. For example, the thermal treatment may be performed at about 1100 to about 1500° C. in the argon atmosphere for about one hour.

Next, the electrode forming process (S223: FIG. 18) is performed. The first electrode 241 is formed on the oxide film 236. The first electrode 241 serves as a gate electrode. The first electrode 241 is, for example, formed by a CVD method. The first electrode 241 is, for example, made of polysilicon containing impurities and having conductivity. The first electrode 241 is formed at a position facing the source region 233 and the body region 232.

Next, an interlayer insulating film 237 that covers the first electrode 241 is formed. The interlayer insulating film 237 is formed by, for example, a CVD method. The interlayer insulating film 237 is, for example, made of silicon dioxide. The interlayer insulating film 237 is formed so as to contact the first electrode 241 and the oxide film 236. Subsequently, the oxide film 236 and the interlayer insulating film 237 at predetermined positions are removed by etching. Thus, the source region 233 and the contact region 234 are exposed from the oxide film 236.

For example, a second electrode 242 is formed on the exposed portion by a sputtering method. The second electrode 242 region serves as a source electrode. The second electrode 242 is made of, for example, titanium, aluminum, silicon and the like. After the second electrode is formed, the second electrode 242 and the silicon carbide epitaxial substrate 100 are heated at, for example, about 900 to 1100° C. Thus, the second electrode 242 and the silicon carbide epitaxial substrate 100 are in contact with each other so as to form an ohmic contact. Next, an interconnection layer 238 is formed so as to contact the second electrode 242. The interconnection layer 238 is, for example, made of a material containing aluminum.

Subsequently, a passivation protective film (not illustrated in the drawing) is formed on the interconnection layer 238 by, for example, plasma CVD. The passivation protective film, for example, contains a SiN film. Part of the passivation protective film is etched up to the interconnection layer 238, and an opening is formed in the passivation protective film to connect a bonding wire thereto. Next, back grinding is performed on a back surface 10A of the silicon carbide single-crystal substrate 10. Thus, the silicon carbide single-crystal substrate 10 is thinned. Next, a third electrode 243 is formed on the back surface 10B. The third back surface 243 serves as a drain electrode. The third electrode 243 is, for example, made of an alloy containing nickel and silicon (for example, NiSi and the like).

Figure 21:
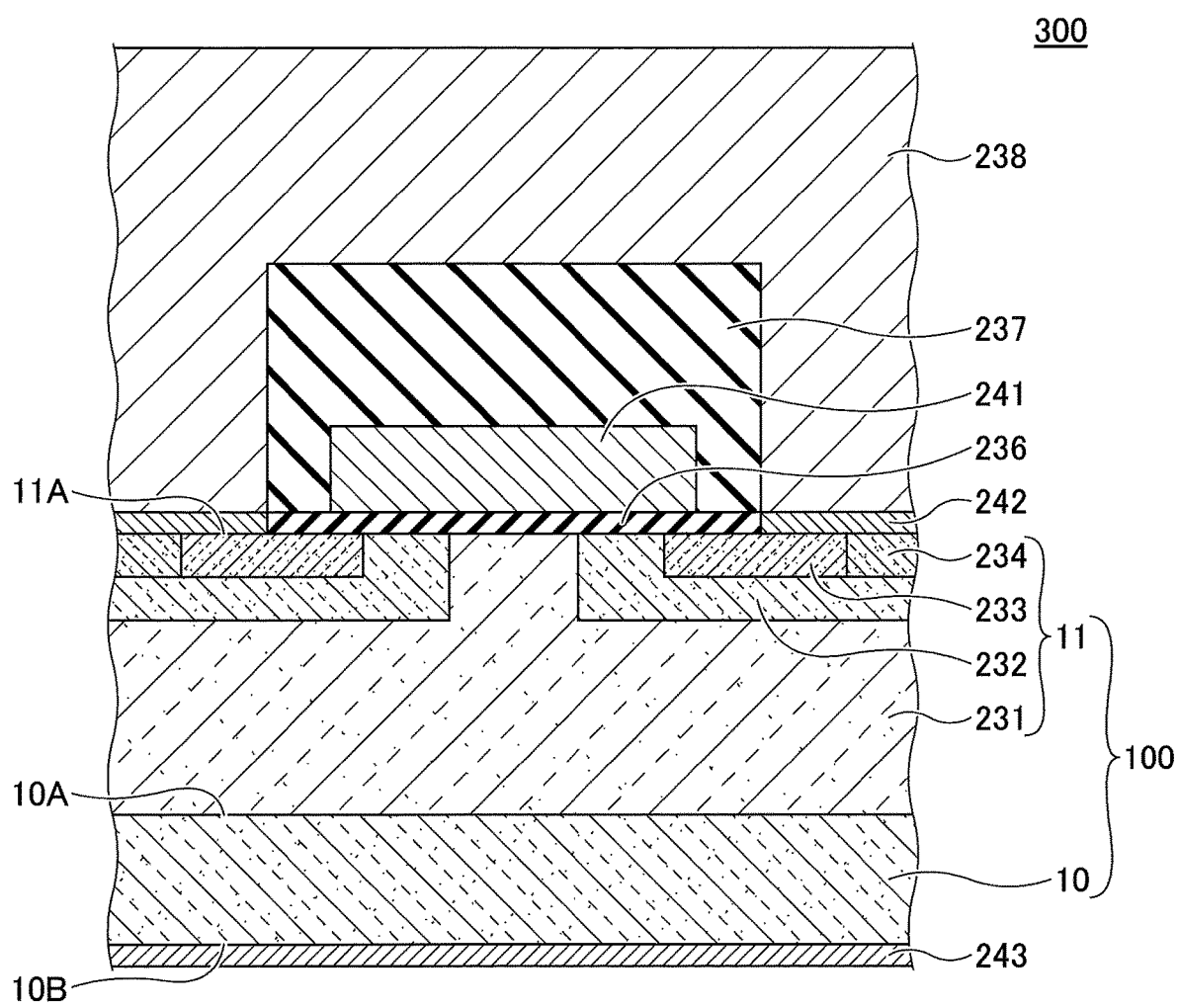
FIG. 21 is a process chart (3) of a method for manufacturing a silicon carbide semiconductor device according to an embodiment of the present disclosure.

Next, a dicing process (S224: FIG. 18) is performed. For example, the silicon carbide epitaxial substrate 100 is divided into a plurality of semiconductor chips by dicing the silicon carbide epitaxial substrate 100 along dicing lines. Thus, a silicon carbide semiconductor device 300 is manufactured (see FIG. 21).

In the above, the method for manufacturing the silicon carbide semiconductor device is described by illustrating a MOSFET, the manufacturing method according to the present disclosure is not limited to this. The manufacturing method according to the present disclosure can be applied to, for example, a variety of silicon carbide semiconductor devices such as an IGBT (Insulated Gate Bipolar Transistor), a SBD (Schottky Barrier Diode), a thyristor, a GTO (Gate Turn Off thyristor) and a PiN diode.

Although the embodiments have been described hereinabove, it is understood that the embodiments disclosed herein are illustrative and non-restrictive in any respect. The scope of the present invention is intended to include any modifications without departing from the scope of the present disclosure.

DESCRIPTION OF THE REFERENCE NUMERALS 1 film deposition apparatus
1A chamber
3 induction heating coil
4 quartz tube
5 heat insulating material
6 heating element
6A curved part
6B flat part
10 silicon carbide single-crystal substrate
10A principal surface
10B back surface
11 silicon carbide epitaxial layer
11A surface
100 silicon carbide epitaxial substrate
110 basal plane dislocation
111 basal plane dislocation
111a one end
111b other end
112 other basal plane dislocation
120 threading screw dislocation
231 drift region
232 body region
233 source region
234 contact region
236 oxide film
237 interlayer insulating film
238 interconnection layer
241 first electrode
242 second electrode
243 third electrode

The invention claimed is:

1. A silicon carbide epitaxial substrate comprising:
a silicon carbide single-crystal substrate having a diameter of 100 mm or larger and including a principal surface inclined at an angle of more than 0 degrees and not less than 8 degrees with respect to a {0001} plane;
a silicon carbide epitaxial layer formed on the principal surface and having a thickness of 20 μm or thicker;
a first basal plane dislocation contained in the silicon carbide epitaxial layer and having one end coupled to a threading screw dislocation contained in the silicon carbide epitaxial layer and the other end present in a surface of the silicon carbide epitaxial layer, the first basal plane dislocation extending in a direction having a slope of 20 degrees or more and 80 degrees or less with respect to a <11-20> direction in a {0001} basal plane; and
a second basal plane dislocation extending in the <11-20> direction coupled to the other end of the first basal plane dislocation,
wherein density of the first basal plane dislocation is 0.05/cm$^2$ or less.

2. The silicon carbide epitaxial substrate as claimed in claim 1, wherein a diameter of the silicon carbide single-crystal substrate is set at 150 mm or larger.

3. A method for manufacturing a silicon carbide semiconductor device, comprising:
a step of preparing a silicon carbide epitaxial substrate as claimed claim 1, and
a step of processing a silicon carbide epitaxial substrate.

* * * * *